United States Patent [19]
Porst et al.

[11] Patent Number: 4,816,984
[45] Date of Patent: Mar. 28, 1989

[54] BRIDGE ARM WITH TRANSISTORS AND RECOVERY DIODES

[75] Inventors: Alfred Porst, Munich; Gerhard Miller, Penzing; Mario Feldvoss, Munich, all of Fed. Rep. of Germany

[73] Assignee: Siemens Aktiengesellschaft, Berlin and Munich, Fed. Rep. of Germany

[21] Appl. No.: 147,418

[22] Filed: Jan. 25, 1988

[30] Foreign Application Priority Data

Feb. 6, 1987 [DE] Fed. Rep. of Germany ....... 3703660

[51] Int. Cl.$^4$ .......................................... H02H 7/122
[52] U.S. Cl. ...................... 363/56; 363/98; 363/132; 323/289
[58] Field of Search ............ 363/56, 17, 98, 132; 323/289; 307/270, 280, 300; 361/400, 401, 404, 409

[56] References Cited

U.S. PATENT DOCUMENTS

| 3,909,695 | 9/1975 | Pzck | 363/17 |
| 4,410,935 | 10/1983 | Dang | 363/98 |
| 4,447,741 | 5/1984 | Moschopoulos | 323/289 |
| 4,520,255 | 5/1985 | Bredenkamp et al. | 363/17 |
| 4,639,823 | 1/1987 | Kuroki | 361/159 |
| 4,716,513 | 12/1987 | ITO | 323/289 |

FOREIGN PATENT DOCUMENTS 0166968 1/1986 European Pat. Off. .

OTHER PUBLICATIONS

Elektric, vol. 36, No. 7, 1982, by Fischer et al., pp. 366–370.
Electronic Design, vol. 29, No. 18, 1981, pp. 13 and 14.
Revue Generale De L'Electricite, No. 9, 1981, by Goeldel et al. pp. 648 to 655.
Elektronik, vol. 24, 1980, by B. Smith, pp. 91 to 94.

Primary Examiner—Peter S. Wong
Attorney, Agent, or Firm—John Francis Moran

[57] ABSTRACT

Inverter circuits are provided with bridge arms which, for example, including series-connected transistors (T11, T21) with one freewheeling diode (D1, D2) each transistor. A critical operating state occurs when the recovery current is switched off by one of the diodes (D1, D2), so that the other transistor (T11, T21) is cut in. The return current, which passes through this diode, can assume such high values, when rapidly cutting in the transistor, that the "dynamic" blocking capability of the diode is exceeded, and the diode is burnt out. The load current and the control current are thus reversed, so that the transistor is switched on more slowly and temporarily takes over part of the voltage which is normally applied to the diode.

18 Claims, 4 Drawing Sheets

BRIDGE ARM WITH TRANSISTORS AND RECOVERY DIODES

BACKGROUND OF THE INVENTION

This invention relates to a semiconductor device including two semiconductor switches connected in series which are each provided with an antiparallel connected recovery diode, as well as a first terminal between the two semiconductor switches and two terminals for supplying an intermediate circuit voltage.

A circuit configuration comprised of these components has been described for instance, in the magazine "Elektronik" 1980, issue 24, pp. 91–94, specifically in connection with illustration (Bild) 3. This circuit configuration in particular finds application in inverters. The switches are triggered by means of impulses, with a frequency which is high in comparison with that of the voltage which is to be generated at the load. This produces problems which are described in connection with FIG. 1.

FIG. 1 illustrates a bridge arm of an inverter whose semiconductor switches respectively take the form of a transistor T1 or T2. The collector of the transistor T1 is designated as C1 and is connected to an input terminal 1 via an inductance $L_s$ which represents the entire leakage inductance of the circuit. The emitter is designated as E1. The emitter E2 of the transistor T2 is connected to an input terminal 2. The collector C2 of transistor T2, and also E1, are connected to the terminal 3. Connected to the terminal 3 is an inductive load L whose terminal is connected with the terminal 2 via another transistor T3. Between the terminals 1 and 2 there is an intermediate circuit voltage $U_{ZW}$. The diodes D1 or D2 are connected in antiparallel fashion to the transistors T1, T2.

In explaining the function, it is assumed that T1 is conductive. A current $I_L$ flows in the direction of the arrow through the load L. When T1 is cut off and becomes nonconductive, the voltage across L drives a freewheeling current $I_F$ through T3 and T2. This current is represented by a dot-dash line. If, during the next cycle T1 is again turned on, the current $I_1$ passing through T1 increases. As the current $I_L$ passing through L, which is related to the clock rate of the circuit, is essentially constant, the diode current $I_D = I_L - I_1$ decreases. Since the diode D2 is then flooded with charge carriers, part of $I_1$ flows in the form of a return current $I_R$ (broken arrow) through D2 to the terminal 2.

The foregoing condition is illustrated in FIG. 2 by means of plots of current and voltage waveforms versus time. Here, the voltage $UT_1$ is applied to T1; the current $I_1$ and the voltage $UD_2$ to D2. The diode current $I_D$ results from $I_L - I_1$. The diode current $I_D$, which thus flows as the return current, assumes values which are considerably higher than the load current. As the return current increases, the diode picks up reverse voltage ($U_{D2}$), and the return current decreases. As the current $I_1$ decreases, a voltage peak—caused by leakage inductance $L_s$—occurs at D2, and is considerably higher than the intermediate circuit voltage $U_{ZW}$.

Due to the high diode voltage and the high return current, the dynamic blocking capability of the diode may be exceeded and the diode destroyed. The voltage peak can be reduced by means of an RCD wiring parallel to the diode. However, this wiring produces additional losses and limits the frequency range.

SUMMARY OF THE INVENTION

It is the object of the present invention to provide a low-loss semiconductor device based upon the above-described circuit configuration, which prevents destruction of the diode.

This object is achieved in that each of the semiconductor switches has at least one load current circuit and at least one control current circuit, and that at least one of the control current circuits and at least one of the load current circuits are so arranged that, in the event of an increase of current in the load current circuit, a reverse voltage is induced in the control current circuit.

BRIEF DESCRIPTION OF THE DRAWING

Features of the invention and additional objects of the invention will be more readily appreciated and better understood by reference to the following detailed description which should be considered in conjunction with the drawing.

Figure 3:
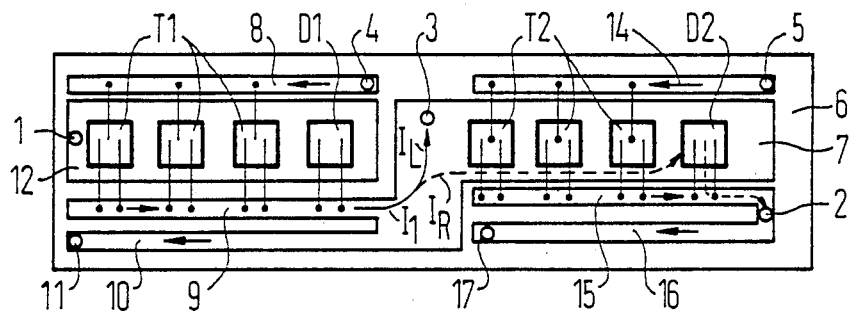

The invention is described in particular by means of various illustrative embodiments depicted as follows:

FIG. 3 is the top view of a first illustrative embodiment of the invention.

Figure 4:
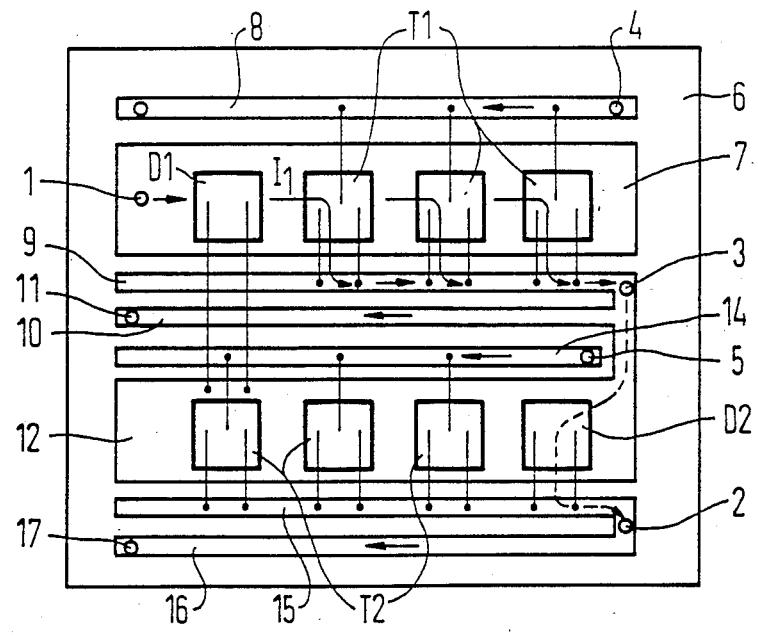

FIG. 4 is the top view of a second illustrative embodiment of the invention.

Figure 5:
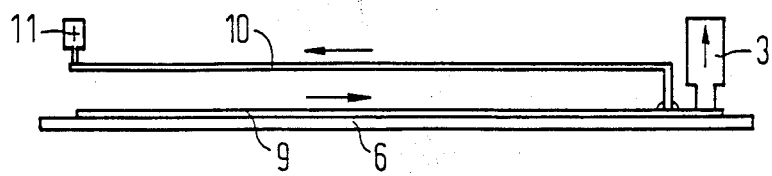

FIG. 5 is an alternate arrangement for the wiring system which increases feedback.

Figure 6:
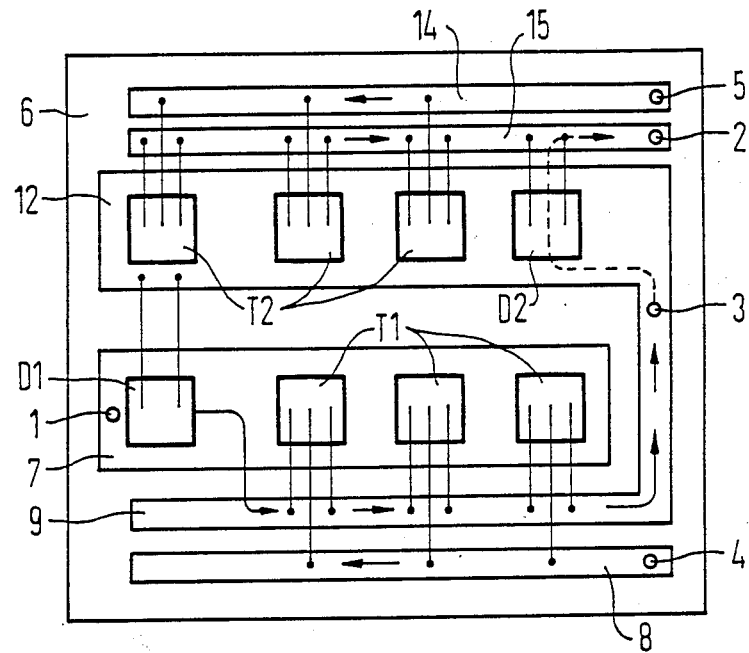

FIG. 6 depicts a third illustrative embodiment of the invention.

Figure 7:
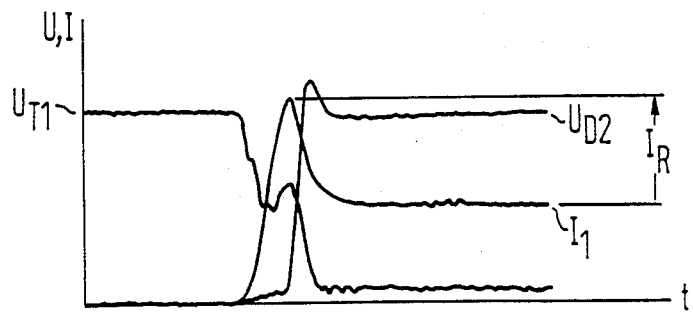

FIG. 7 illustrates a current/voltage time-dependency diagram demonstrating operation in a configuration in accordance with the invention.

Figure 8:
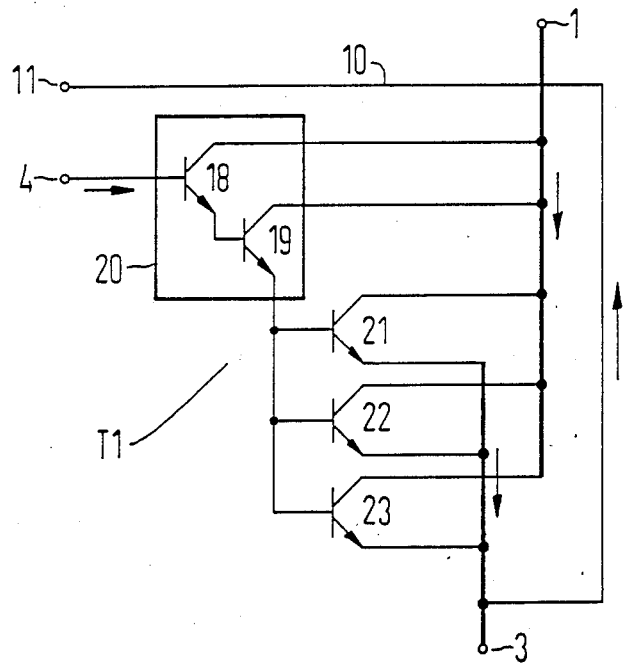

FIG. 8 presents an illustrative embodiment of a semiconductor switching device with bipolar transistors.

Figure 9:
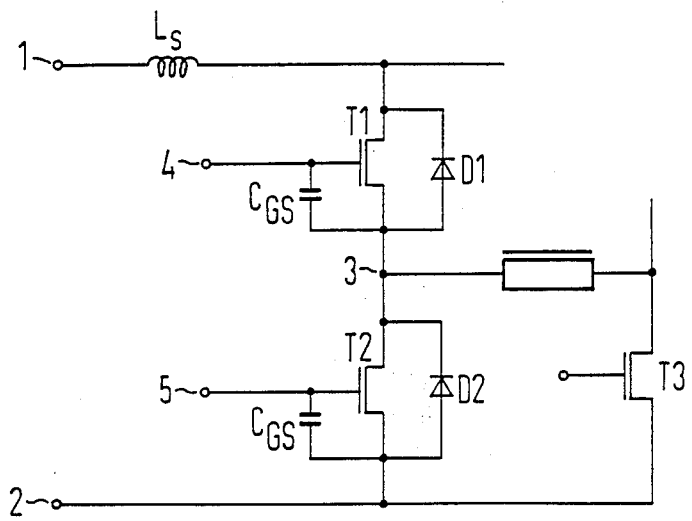

FIG. 9 is a principal circuit diagram of an inverter with power MOSFET.

DETAILED DESCRIPTION

Figure 1:
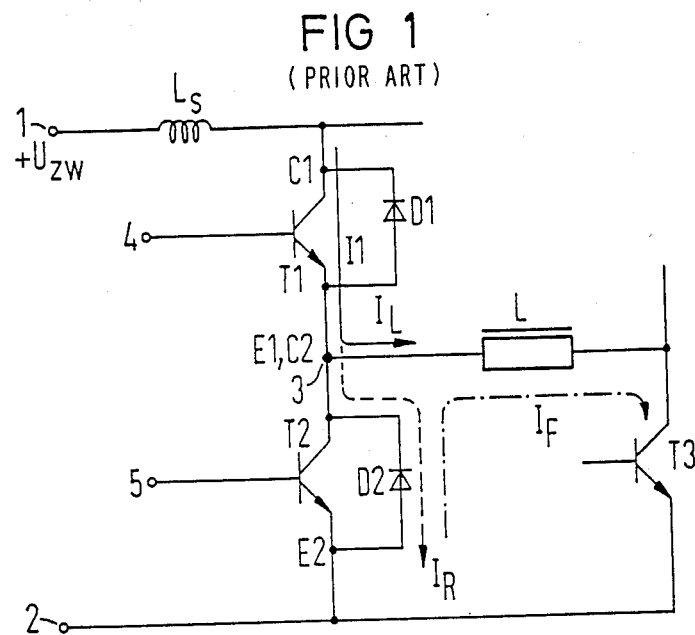
FIGS. 1 and 2 depict the conventional approach and demonstrate its attendant problem.
Figure 2:
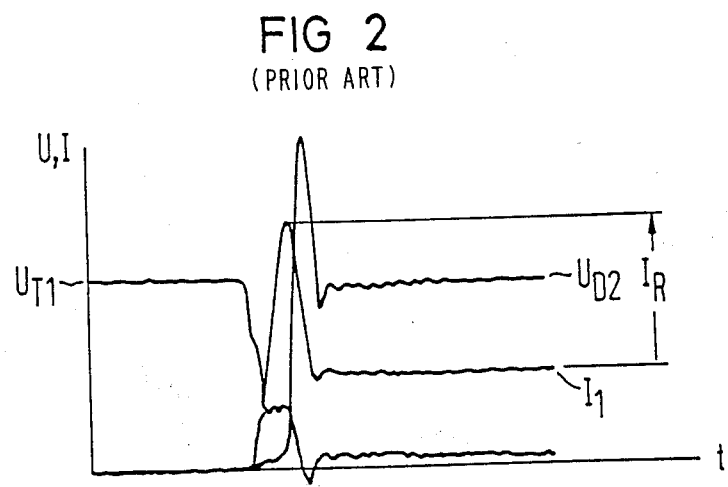

In FIG. 1, the bridge arm is provided with switches T1 and T2 as well as recovery diodes D1 and D2 and is assembled on an insulated substrate 6, as shown in FIG. 3. In FIG. 3, the terminals corresponding to those of FIG. 1 are designated with the same reference numerals. A strip-shaped collector circuit 12 is mounted on the substrate 6 on which one or several semiconductor elements are mounted. Here, three semiconductor elements are shown which are connected in parallel. When bipolar transistors are utilized, these transistors are mounted with the collector portion facing the circuit 12. It is to be understood that although a single transistor T1 may be referred to hereinafter this actually represents a plurality of such devices operating in parallel as evident from FIG. 3. The semiconductor element of the diode D1 is also arranged on this circuit and connected with the circuit contacting the cathode terminal. Along one long side of the circuit 12, there is arranged a base current circuit 8 via which base current is supplied. Along the other long side of the collector circuit 12 an emitter circuit 9 is located. Parallel to the emitter circuit 9 is located a further circuit 10 in the form of a strip conductor which returns the base current to the control circuit (base current return circuit). The circuit is connected at the right-hand side with the emitter circuit 9. At the left end, the circuit is provided with a terminal 11.

The substrate 6 is provided with a second strip-shaped collector circuit 7 on which are arranged the semiconductor elements of the transistor T2. These elements are mounted with the collector terminal on the collector circuit. The semiconductor element of the diode D2 is mounted on the collector circuit 7 and, at the en of the cathode, connected with the diode. Corresponding to the left-hand side (T1, D1), a base current circuit is side of 7 and a base current return circuit 16, and an emitter circuit 15 on the other side. The two latter circuits are interconnected at the right-hand side. At its left end, the circuit 16 is provided with a connecting contact 17. The transistors T1 and T2 are connected in series due to the fact that the emitter circuit 9 is connected with the collector circuit 7.

For this function of the inductive negative feedback between the circuits conducting control current and load current it is essential, first, that the return circuits 10, 16 are at least in part located parallel to the emitter circuits 9 of 15. Secondly, the location of the terminals is significant, through which the load current is fed/discharged and the base current is fed/collected. In the illustrative embodiment, the terminal 1 is arranged at the left end of the circuit 12. The load current fed by this current flows from T1 through the parallel connected semiconductor elements and from there into the emitter circuit 9 via bond wires. The emitter current flows as a current $I_1$ toward the right, where it branches off and then, on the one hand, flows as a load current $I_L$ through the terminal 3 and, on the other hand, as a diode current to the terminal 2. The drawn-in circuit diagrams correspond with the operating state described by means of FIG. 1.

The on-state transistor T1 is controlled through feeding the base current into the terminal 4. The base current flows via the base emitter path of the transistors T1 into the emitter circuit 9 and returns to the current source via the circuit 10, as is indicated by arrows. In the event that the load current flowing between terminals 1 and 3 increases rapidly, a reverse voltage in the direction of the control circuit voltage is induced in this region of the control circuit line, which thus reduces the base current and slows down the speed of switching on transistor T1. This reduces the overvoltage applied to the diode D2 as well as the return current passing through D2.

The same applies when the transistor T2 interacts with the diode D1. This situation arises when the load current $I_L$ passes through the load L in the reverse direction, as is shown in FIG. 1. For this purpose, the transistor T2 is controlled conductively. When T2 is turned off, a recovery current correspondingly passes through the diode D1. When T2 is turned on again, an overvoltage and a high return current will likewise occur at D1. The rapid switching on of transistor T2 will be prevented by a reverse voltage at the base current return circuit 16. This is ensured by the position of the terminals 2 and 17. Apart from the position of the terminals 11 and 17, the position of the terminals 4 and 5 also plays an important role, for negative feedback also occurs between the base current circuits 8, 14 and the circuits 7, 12.

In order to ensure an effective amount of negative feedback, the position of the load current terminals 1, 2 and that of the diodes D1 and D2 is selected in such a way that the current path for the current of one of the transistors, together with the current path of the diode current $I_R$, passes, if possible in one direction only, through the diode associated to the other transistor. In the illustrative embodiment in accordance with FIG. 3 this is achieved due to the fact that the terminal 1 is arranged at the left end of the configuration and the terminal 2 at the right end of the configuration. In the above case the semiconductor elements of D1 and D2, which are arranged on the right-hand side of the respective collector circuit 12, 7, may also be arranged on the left-hand side or between the transistor semiconductor elements.

The illustrative embodiment according to FIG. 4 varies from that of FIG. 3 mainly in that the collector circuits 7 and 12, relative to their longitudinal axis, are not connected in series but parallel. As for the rest, similar components, or components performing similar functions, have been the same reference numerals or symbols as in FIG. 3. The terminal 3 for the collector of T2 and the emitter terminal of T1 are located at the right-hand side of the emitter circuit 9. The terminal 11 for the base current circuit 10 is located at the left open end of this circuit. Load current and base current flow through the terminal 11 toward each other, thus ensuring the slow turning on of transistor T1. The diode D1 is, at the anode end, connected with the conducting path 12 of T2 of the collector via bond wires. The current of transistor T1 flows in the direction of the terminal 3, as is indicated by the broken arrows. Here, it branches off in load current $I_L$ and diode current (indicated by a broken line) $I_R$. The current flows toward the terminal 2. The direction of flow of the load current is essentially from left to right. This is achieved primarily due to the position of D2 at the right end of the collector circuit 12. If the collector circuit were to be arranged at the left end of 12, the current would flow from right to left, the electromagnetic field would counterbalance and the negative feedback be weakened. The terminal 4 is located at the right end of the circuit 8.

The same applies to the interaction of transistor T2 with the diode D1, whose layout corresponds with that of transistor T2 in FIG. 3. Here, a uniform current direction is achieved due to the fact that diode D1 is located at the left end of the collector circuit 7 and connected with the opposite left end of the collector circuit 12 by means of bond wires. Correspondingly, the terminal 1 is located at the left end of collector circuit 7 and the terminal 2 at the right end of the emitter circuit 15. The terminal 5 is located at the right end of the circuit 14.

In FIGS. 3 and 4, the base current return circuits are in the form of conducting paths applied to the substrate. Normally they will not produce adequate feedback. A more favorable feedback is achieved when the base current return circuits 10, 16 are arranged above the emitter circuits 9, 15. As is illustrated in FIG. 5, the return circuit can, for example, be formed by a punched out sheet metal strip, one end of which is soldered together with the emitter circuit 9 or the connecting contact 3. A corresponding configuration can be provided for the transistor T2. The return circuit also runs parallel to the emitter circuit. As this produces a better feedback than with the return circuits applied to the substrate, the position of the terminals 4, 5 on the circuits 8, 14 is then practically unimportant.

FIG. 6 depicts an illustrative embodiment in which the reverse voltage is automatically induced in the base current circuit. The base current circuits 8, 14 and the emitter circuits 9, 15 respectively are located at the outside of the two opposite, series-connected collector circuits 7 or 12. The configuration of the diodes D1 and D2, as well as the position of the connecting contacts 2, 3 and 4, have been selected in such a way that the current path from the transistor current of the opened transistor (unbroken arrow), together with that of the diode current (broken arrow) essentially run in one direction. With the conductive transistors T2, this can be achieved in that the semiconductor body of the diode D1 is placed adjacent to the terminal 1 and connected with the collector circuit 12 via bond wires at the anode end.

The diagram in FIG. 7 shows that, in contrast to a semiconductor device without negative feedback, the negative feedback provided in accordance with the invention strongly reduces not only the current $I_1$ passing through the transistor T1, and consequently the return current $I_R$ passing through D2, but also the overvoltage occurring at diode D2. This is achieved by a slower switching of the transistor. This is expressed in the diagram by the tendency towards a slower drop of the transistor voltage $UT_1$. The transistor T2 shows a corresponding behavior when acting together with diode D1.

In the illustrative embodiments, the transistors are formed by three parallel connected semiconductor elements. A different type of assembly is possible. FIG. 8 shows a transistor switching device which is provided with a Darlington stage 20 formed by two bipolar transistors 18, 19. The emitter current of the Darlington stage is then fed to three parallel connected bipolar transistors 21, 22 and 23. As for the rest, similar components, or components performing the same function, have the same reference symbols as the other figures. In FIG. 8, the load current is shown by two downward-pointing unbroken arrows and the base return current by an upward-pointing broken arrow.

Power MOSFETs may be substituted as bipolar transistors for the transistor switches. This is shown in FIG. 9. The diode D1 is connected antiparallel to the MOSFET T1, which is related to the direction of current flowing through MOSFET T1. While the anode of the diode D1 is connected to the source terminal of T1, its cathode is connected to the drain terminal of MOSFET 1. The diode D2 is antiparallel connected with the power MOSFET T2 which is related to the direction of current flowing through T2. The anode of the diode D2 is connected to the source terminal of said power MOSFET while the cathode is connected to the drain terminal of MOSFET T2. The gate feed lines of MOSFET's T1 and T2 are located at the terminals 4 or 5. In the illustrative arrangements in accordance with FIGS. 3, 4 and 6, MOSFET semiconductor elements are substituted correspondingly for the bipolar semiconductor elements. The base current circuit becomes the gate-current circuit, the base current return circuit the gate current return circuit, the emitter circuit the source circuit and the collector circuit the drain circuit. Here, the negative feedback, similar t that of FIGS. 3 and 4, can act between a gate current return circuit and the source circuit or between the gate current circuit and the source circuit (see FIG. 6). For practical reasons, similar to that of the illustrative embodiments shown in FIGS. 3 and 4, the gate current return circuits are arranged above the source circuit as shown in FIG. 5.

GTO thyristors may, for example, be used as semiconductor switching devices instead of bipolar transistors of the MOSFET.

There has thus been shown and described novel circuit arrangements particularly suitable for inventors which fulfill all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention which is limited only by the claims which follow.

We claim:

1. A semiconductor circuit including two semiconductor switching devices serially connected and each having an antiparallel connected free wheeling diode, the semiconductor circuit comprising a first terminal between said two semiconductor devices and two terminals for supplying an intermediate circuit voltage, each of the semiconductor devices being provided with at least one load current circuit and at least one control current circuit, and at least one of the control current circuits and at least one of the load current circuits being arranged to induce a reverse voltage in the control current circuit during an increase of current in the load current.

2. A semiconductor circuit according to claim 1, further comprising a substrate wherein the load current circuit and the control current circuit are mounted adjacently on the substrate and wherein the control current circuit at least in part, is mounted parallel to the load current circuit.

3. A semiconductor circuit according to claim 1, wherein each semiconductor device is provided with at least one bipolar transistor; each device is coupled to a base current circuit, a substrate supporting an emitter circuit and a collector circuit mounted thereon; the base current circuit is mounted either adjacent to the emitter circuit or the collector circuit; a terminal of the base current circuit, a collector terminal and an emitter terminal each having locations so that the currents in two adjacent circuits flow in opposing directions to each other.

4. A semiconductor circuit according to claim 2, wherein each semiconductor device is provided with at least one bipolar transistor; each device is coupled to a base current circuit, a substrate supporting an emitter circuit and a collector circuit mounted thereon; the base current circuit is mounted either adjacent to the emitter circuit or the collector circuit; a terminal of the base current circuit, a collector terminal and an emitter terminal each having locations so that the currents in two adjacent circuits flow against each other.

5. A semiconductor circuit as defined in claim 1, wherein each semiconductor device comprises at least one bipolar transistor and each switching device includes a base current circuit, an emitter circuit and collector circuit mounted to a substrate; each switching device is provided with a base current return circuit which is connected with the emitter circuit; the base current circuit is mounted adjacent and, at least in part, parallel to the emitter circuit; and a terminal of the base current return circuit having a first position, an emitter terminal having a second position and a connection between the emitter circuit and the base current return circuit, the respective first and second positions and the connections are located in such a way that, when switching on the current in the base current return circuit and the current in the emitter current circuit flow against each other.

6. A semiconductor circuit as defined in claim 2, wherein each semiconductor device comprises at least one bipolar transistor and each switching device includes a base current circuit, an emitter circuit and a collector circuit mounted to a substrate; each switching device is provided with a base current return circuit which is connected with the emitter circuit; the base current circuit is mounted adjacent and, at least in part, parallel to the emitter circuit; and a terminal of the base current return circuit having a first position, an emitter terminal having a second position and a connection between the emitter circuit and the base current return circuit, the respective first and second positions and the connections are located in such a way that, when switching on the current in the base current return circuit and the current in the emitter current circuit flow against each other.

7. A semiconductor circuit as defined in claim 5, wherein the base current return circuit is arranged at a distance from the substrate above the emitter circuit.

8. A semiconductor circuit as defined in claim 5, wherein the base current return circuit is formed as a base conducting path mounted to the substrate and arranged adjacent to the emitter circuit.

9. A semiconductor circuit as defined in claim 1, wherein the semiconductor elements of the bipolar transistors and those of the freewheeling are mounted, at the collector end and the cathode end respectively, to the collector circuits, and the semiconductor elements of the freewheeling diodes respectively are so mounted to a determined point of the collector circuit that the load current path passing through the transistor of one of the circuits, together with the return current path passing through the freewheeling diode of the other circuit, essentially flows in the same direction.

10. A semiconductor circuit as defined in claim 2, wherein the semiconductor elements of the bipolar transistors and those of the freewheeling are mounted, at the collector end and the cathode end respectively, to the collector circuits, and the semiconductor elements of the freewheeling diodes respectively are so mounted to a determined point of the collector circuit that the load current path passing through the transistor of one of the circuits, together with the return current path passing through the freewheeling diode of the other circuit, essentially flows in the same direction.

11. A semiconductor circuit as defined in claim 3, wherein the semiconductor elements of the bipolar transistors and those of the freewheeling are mounted, at the collector end and the cathode end respectively, to the collector circuits, and the semiconductor elements of the freewheeling diodes respectively are so mounted to a determined point of the collector circuit that the load current path passing through the transistor of one of the circuits, together with the return current path passing through the freewheeling diode of the other circuit, essentially flows in the same direction.

12. A semiconductor circuit as defined in claim 5, wherein the semiconductor elements of the bipolar transistors and those of the freewheeling diodes are mounted, at the collector end and the cathode end respectively, to the collector circuits, and the semiconductor elements of the freewheeling diodes respectively are so mounted to a determined point of the collector circuit that the load current path passing through the transistor of one of the circuits, together with the return current path passing through the freewheeling diode of the other circuit, essentially flows in the same direction.

13. A semiconductor circuit as defined in claim 7, wherein the semiconductor elements of the bipolar transistors and those of the freewheeling diodes are mounted, at the collector end and the cathode end respectively, to the collector, circuits, and the semiconductor elements of the freewheeling diodes respectively are so mounted to a determined point of the collector circuit that the load current path passing through the transistor of one of the circuits, together with the return current path passing through the freewheeling diode of the other circuit, essentially flows in the same direction.

14. A semiconductor circuit as defined in claim 1, wherein the semiconductor devices comprise a plurality of parallel-connected transistors.

15. A semiconductor circuit as defined in claim 14, wherein a Darlington stage is connected before the transistors.

16. A semiconductor circuit as defined in claim 1, wherein each semiconductor device is provided with at least one power MOSFET; each circuit is provided with a gate current circuit mounted to a substrate and with a source circuit; the gate current circuit is mounted adjacent to the source circuit and the position of the terminals of said circuits being selected that the currents in said circuits flow against each other when the MOSFET's are switched on.

17. A semiconductor circuit as defined in claim 1, wherein each semiconductor switch is provided with at least one power MOSFET; each circuit is provided with a gate current circuit mounted to a substrate and with a source circuit; a gate current return circuit is provided for each switch which is connected with the source circuit; the gate current return circuit and the source circuit are mounted adjacent and, at least in part, parallel to said circuit; the position of the terminals at the gate current return circuit and at the source circuit, as well as that of the connection between the gate current return circuit and the source circuit, are so determined that, when switching on, the currents in the source circuit and in the gate return circuit flow against each other.

18. A semiconductor circuit as defined in claim 2, wherein each semiconductor switch is provided with at least one power MOSFET; each circuit is provided with a gate current circuit mounted to a substrate and with a source circuit; a gate current return circuit is provided for each switch which is connected with the source circuit; the gate current return circuit and the source circuit are mounted adjacent and, at least in part, parallel to said circuit; the position of the terminals at the gate current return circuit and at the source circuit, as well as that of the connection between the gate current return circuit and the source circuit, are so determined that, when switching on, the currents in the source circuit and in the gate return circuit flow against each other.

* * * * *